FABRICATION OF THREE-DIMENSIONAL PRINTED CIRCUITRY
Filed Sept. 20, 1965
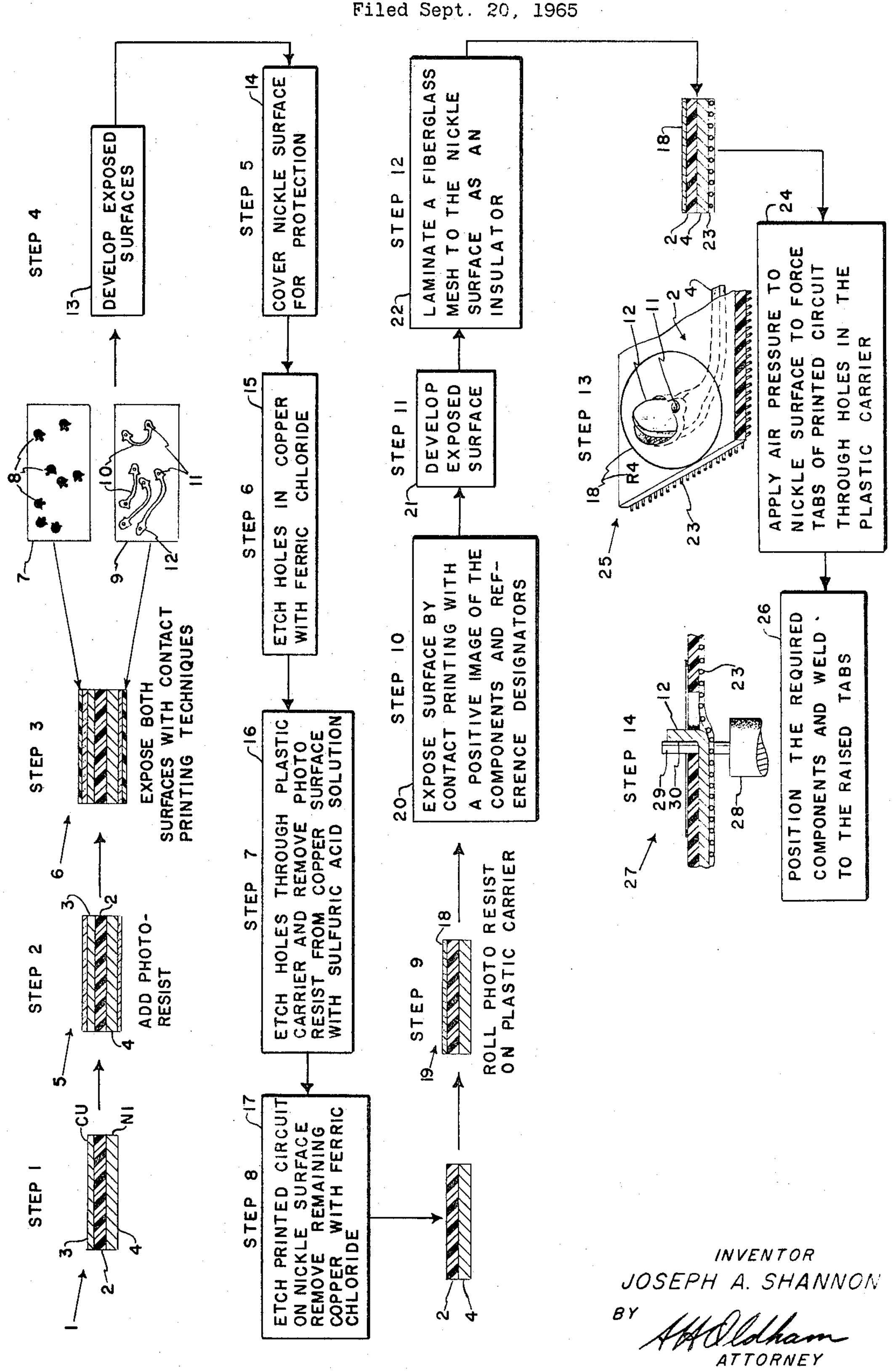
INVENTOR
JOSEPH A. SHANNON
BY A. H. Oldham
ATTORNEY 3,384,957

FABRICATION OF THREE-DIMENSIONAL PRINTED CIRCUITRY

Joseph A. Shannon, Akron, Ohio, assignor to Goodyear Aerospace Corporation, Akron, Ohio, a corporation of Delaware Filed Sept. 20, 1965, Ser. No. 488,490
9 Claims. (Cl. 29—626)

ABSTRACT OF THE DISCLOSURE

The invention provides a method for fabrication of a three-dimensional printed circuit utilizing photo resist in combination with acid etching techniques to achieve a nickel layer on a plastic base carrier whereby raised nickel tabs are associated with the circuit components in exposed and easily accessible relationship allowing resistance or other type welding techniques to achieve a superior electrical connection, and which method overcomes the inherent disadvantages of nickel ribbon for making printed circuitry.

This invention relates to a novel method for fabrication of three-dimensional printed circuitry, and more particularly to a unique method to form printed circuitry with raised tabs to which the necessary electrical components may be easily welded or otherwise electrically connected.

Rapid advances in the development of miniature and micro-miniature circuits have created a need for efficient, functionally compatible methods of high density packaging of electronic circuits. These small, highly reliable circuits are finding rapidly increasing use in computers, control devices, operating devices, instrumentation, aerospace and under water devices and in other applications subject to extreme environments or requiring maximum reliability as well as minimum weight and volume.

At present, copper circuit boards are used extensively in other electronic applications. However, they are inadequate for miniature or microminiature modules because they are essentially two dimensional in practice. Reliability of soldered joints can be a problem and excessive heating of delicate components during assembly is a serious problem. For these and additional reasons it has been necessary to find alternative solutions. The use of resistance welding or welding before assembly has been an attractive technique to provide strong, compact, reliable electrical connections normally resistant to extreme environments, and to minimize the heat exposure of components during assembly. A great deal of effort has been expended in determining the optimum material for such interconnecting networks. Such efforts have revealed that annealed, commercially pure nickel possesses superior properties over alternative materials because of its outstanding resistance welding characteristics, good electrical conductivity, tarnish and corrosion resistance, and excellent mechanical properties.

However, nickel ribbon currently being used is time consuming, awkward, restrictive, space consuming, inflexible, and presents design and quality maintenance drawbacks. The maximum benefits of high density packaging are not fully attainable with the use of nickel ribbon.

Therefore, it is the general object of the present invention to avoid and overcome the foregoing and other difficulties of and objections to prior art practices by the provisions of a unique method for fabrication of three dimensional printed circuitry which is extremely simple, highly reliable, inexpensive, and achieves a superior printed circuit module.

A further object of the invention is to provide a fabrication technique for three dimensional printed circuitry which utilizes photo resist in combination with acid etching techniques to achieve a three dimensional printed circuit design of a nickel layer on a plastic carrier, thereby overcoming the inherent disadvantages of ribbon nickel.

A further object of the invention is to provide a three dimensional printed circuit where raised nickel tabs are associated with each component of the circuit to allow resistance or other type welding in such third dimension, thereby achieving a highly superior electrical connection.

A further object of the invention is to achieve a three dimensional printed circuit which may be stacked in module component relationship with no danger of electrical shorting, and where the fabrication is easily and inexpensively accomplished.

The aforesaid objects of the invention and other objects which will become apparent as the description proceeds are achieved by providing a method to make three dimensional printed circuits which comprises the steps of adhering a thin copper layer to one surface of a plastic carrier, adhering a nickel layer to the other surface of the plastic carrier, adding a thin photo resist layer to both metal layers, exposing the photo resist layer adjacent the nickel with a printed circuit design including tabs associated with necessary holes, exposing the photo resist layer adjacent the copper wth a hole pattern coinciding with the necessary holes in the printed circuit design, acid etching the hole design through the copper layer while masking the acid from the nickel layer, acid etching holes through the carrier in line with the hole designs through the copper layer and simultaneously removing the photo resist layer on the copper layer without effecting either metal layer, acid etching the printed circuit design on the nickel layer and simultaneously allowing the acid to eat away the remainder of the copper layer, printing on the exposed surface of the carrier component and reference designator information, applying an insulating laminate over the nickel layer, forcing the tabs of the nickel layer printed circuit design through the respective holes in the carrier, positioning necessary component wires through their respective holes in the printed circuit design, and welding the wires to the respective tabs associated with each hole.

For a better understanding of the invention reference should be had to the accompanying drawing which sequentially shows in partial block diagram, and partial schematic illustration, the process steps embodied in the invention.

Thus, with reference to the drawings, the numeral 1 indicates generally a cross sectional view of a sheet of material which is produced as the first step of the invention and is adapted to be transformed under the remaining steps or processes of the invention. Essentially, the material 1 includes a plastic base carrier 2 which has a thin copper layer 3 adhered to the top surface thereof and a nickel layer 4 adhered to the bottom surface thereof. The invention contemplates that the plastic carrier 2 will preferably be clear and transparent, and may be made from a well known film on the market called Mylar, made by the E. I. du Pont de Nemours & Company. In the usual practice of the invention, the carrier layer 2 will be between about .005 inch to about .010 inch in thickness with the copper layer 3 being in the range of about .001 to about .003 inch, and the nickel layer 4 being of about the same thickness range as the carrier 2. Any suitable means to adhere the copper and nickel layers 3 and 4 to the carrier 2 are contemplated by the invention.

The second step in the process is indicated generally by numeral 5, and in essence consists of adding a photo resist to both metal surfaces. Any suitable resist such as KPR or KMER photo resist material made by the Eastman Kodak Company will satisfy the requirements of the invention. It should be understood at this point that the purpose of the copper layer 3 is to act as a mask for acid etching the plastic carrier 2, since a photo resist will not meet the resistance requirements with the acid necessary for etching the plastic carrier.

Thus, with both metal surfaces properly coated with a thin layer of photo resist material, the third step of the invention involves exposing both photo resist surfaces under normal contact printing techniques, as indicated generally by numeral 6. In this instance, the photo resist layer adjacent the copper 3 is exposed with a positive image 7 which defines a plurality of holes 8 having tag fingers thereof. However, the photo resist layer adjacent the nickel 4 is defined with a negative print 9 and includes a printed circuitry design 10, wherein the design 10 includes holes 11 with associated tab portions 12. Naturally, the holes 11 and tabs 12 are aligned or in registry with the hole configurations 8 exposed on the positive 7 in order to provide the three dimensional effect, as more particularly described hereinafter.

Step four involves simply developing the exposed photo resist surfaces, and is indicated by numeral 13. Then the nickel surface 4 and photo resist thereon are covered for protection, as indicated by step five and identified by numeral 14. This is followed by step six which consists of an etching of the exposed designs in the photo resist on the copper surface. Normally, a suitable solution of ferric chloride at proper temperature will be used for this purpose. Thus, it should be understood that the hole designs 8, as indicated on the contact printing positive 7 are now etched through the copper layer 3. Step six is indicated by numeral 15.

Following the proper etching of the holes through the copper surface, and with the nickel surface still properly protected, the entire laminate is dipped into a suitable solution of sulfuric acid to etch the hole through the plastic carrier 2, while at the same time removing the remainder of the photo resist from the copper surface 3. This is step seven and is indicated by block 16.

Upon completion of the etching of the holes through the plastic carrier, the surface protection of the nickel layer and its photo resist layer will be removed and the printed circuit design then etched onto the nickel layer, with a suitable solution again of ferric chloride. Naturally, at the same time, the remainder of the copper layer 3 will be removed. Because of the positive image printed on the photo resist, only the printed circuit design will remain of the nickel layer. This is step eight and is indicated by block 17. Thus, it should be understood that the laminate now appears only as the base carrier 2 with the holes properly etched therethrough, as described in step 16, and the printed circuit design remaining of the nickel layer 4.

At this point, in order to appropriately indicate the component and reference designators, a photo resist layer 18 is preferably rolled onto the top surface of the plastic carrier 2, as indicated by step nine and numeral 19. The photo sensitive resist layer 18 is then exposed, preferably by contact printing techniques, with a positive image of the components and reference designators, as indicated by step ten and numeral 20. The exposed surface 18 is then developed, as indicated by step eleven and numeral 21. This then appropriately provides the preferably transparent plastic carrier 2 with information on the top surface thereof to assist in the assembly of the components with the printed circuit design represented by the nickel layer on the bottom surface thereof.

In order to properly insulate the nickel printed circuit design from contact with any component housing, or other design when such are stacked in module form, or the like, the invention contemplates laminating a suitable insulating mesh to the nickel surface, as indicated by step twelve and shown in block 22. Normally, this will probably be a suitable fiber glass mesh, although any appropriate insulation material which is easily applied and provides some type of mesh covering will meet the objects of the invention. Thus, a mesh insulator layer 23 is indicated associated with the nickel layer circuit 4, carrier 2, and exposed top surface 18. The insulator will preferably adhere in fixed relationship to the plastic carrier 2, but will not adhere to the printed circuit itself because of the dissimilar chemical characteristics thereof.

Therefore, the tab portions 12 associated with the printed circuit may be bent up through the associated holes 8 formed in the plastic carrier 2, as described with reference to the previous steps above. Any suitable manner of bending such tabs up through the holes to achieve the three dimensional characteristics of the printed circuit may be utilized. One suitable method would be to apply air pressure to the nickel surface side of the plastic carrier thereby forcing the thin and very easily bendable tabs 12 through the holes 8 in the carrier 2. Such air pressure step 13 is indicated by block 24 with a three dimensional illustration of the tabs bent up through the holes illustrated generally by numeral 25. Preferably, it will be desired to bend the tabs up substantially normal or perpendicular to the carrier 2. Of course, other suitable means, mechanical or otherwise may be used to bend the tabs into position.

It should be understood that the insulation 23 might be positioned after the tabs are bent up into position. if adherence and difficulty in the bending to position are problems.

The final step in the completion of the three dimensional printed circuit then includes positioning the required components through the respective holes 11 and resistance or otherwise welding the exposed contacts to the respective tabs 12. Such step fourteen is indicated by block 26 with an enlarged cross sectional illustration of such final configuration indicated generally by numeral 27. The component 28 has its associated conductor 29 passed through the appropriate hole 11 in the nickel circuit. The weld between the conductor 29 and tab 12 then occurs at 30, and is made on the easily accessible exposed three dimensional side of the tab 12. It should be noted with reference to this illustration that the insulation mesh 23 retains its form around the tab 12 before such tab has been forced into the vertical three dimensional configuration.

It should be understood that resistance type or other suitable welding techniques are greatly enhanced because of the tab association of the printed circuit providing the three dimensional characteristics. This type of printed circuit can be formed to extremely small size and close tolerances utilizing the photographic reproduction contact printing technique which eliminates the uneven printed circuit lines associated with acid etching techniques because of raggedness to the lateral edges of the exposed designs. The three dimensional printed circuit component formed by this technique is readily adaptable to more compact type module packaging in stacked layers because of the greater strength and electrically superior characteristics of the three dimensional circuit, also providing easier assembly because of the simpler welding techniques available, while not damaging components because of excessive heat.

While in accordance with the patent statutes only one best known embodiment of the invention has been illustrated and described in detail, it is to be particularly understood that the invention is not limited thereto or thereby, but that the inventive scope is defined in the appended claims.

What is claimed is:

1. A method to make printed circuits which comprises the following steps adhering a thin copper layer to one surface of a plastic carrier, adhering a thin nickel layer to the other surface of the plastic carrier, adding a thin photo resist layer to both metal layers, exposing the photo resist layer adjacent the nickel with a printed circuit design including tabs associated with necessary holes, exposing the photo resist layer adjacent the copper with a hole pattern coincident with the necessary holes in the printed circuit design, acid etching the hole design through the copper layer while masking the acid from the nickel layer, acid etching holes through the carrier in line with the hole design through the copper layer and simultaneously removing the photo resist layer on the copper layer without effecting either metal layer, acid etching the printed circuit design on the nickel layer and simultaneously allowing the acid to eat away the remainder of the copper layer, printing on the exposed surface of the carrier component and reference designator information, applying an insulating laminate over the nickel layer, forcing the tabs of the nickel layer printed circuit design through the respective holes in the carrier, positioning necessary component wires through their respective holes in the printed circuit design, and welding the wires to the respective tabs associated with each hole.

2. A method according to claim 1 where the etching of both metal layers is accomplished with a ferric chloride solution.

3. A method according to claim 1 where the etching of the plastic carrier is with a sulfuric acid solution.

4. A method according to claim 1 where air pressure is applied to the nickel surface to force the tabs of the printed circuit pattern through the holes in the plastic carrier.

5. A method according to claim 1 where resistance welding is utilized to weld the wires to the respective tabs associated with each hole.

6. A method to make printed circuits on a plastic carrier having a thin layer of nickel on one surface and a thin layer of copper on the other surface which comprises the following steps adding a thin photo resist layer to both metal layers, exposing the photo resist layer adjacent the nickel with a printed circuit design including tabs associated with necessary holes, exposing the photo resist layer adjacent the copper with a hole pattern coincident with the necessary holes in the printed circuit design, acid etching the hole design through the copper layer, acid etching holes through the carrier in line with the hole design through the copper layer and simultaneously removing the photo resist layer on the copper layer, acid etching the printed circuit design on the nickel layer and simultaneously allowing the acid to eat away the remainder of the copper layer, forcing the tabs of the nickel layer printed circuit design through the respective holes in the carrier, positioning necessary component wires through their respective holes in the printed circuit design, and welding the wires to the respective tabs associated with each hole.

7. A method according to claim 6 where the etching of both metal layers is accomplished with a ferric chloride solution.

8. A method according to claim 6 where the etching of the plastic carrier is with a sulfuric acid solution.

9. A method according to claim 6 where the component wires are insulated from all other tabs and electrically conductive portions of the printed circuit.

References Cited

UNITED STATES PATENTS

| | | | |
|---|---|---|---|
| 3,151,278 | 8/1964 | Elarde | 29—626 |
| 3,311,966 | 8/1967 | Shaheen et al. | 29—530 |

JOHN F. CAMPBELL, *Primary Examiner.*

R. W. CHURCH, *Assistant Examiner.*